US008492755B2

(12) United States Patent
Hu et al.

(10) Patent No.: US 8,492,755 B2
(45) Date of Patent: Jul. 23, 2013

(54) THIN FILM TRANSISTOR AND PRESS SENSING DEVICE USING THE SAME (75) Inventors: Chun-Hua Hu, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 81 days.

(21) Appl. No.: 13/323,911

(22) Filed: Dec. 13, 2011

(65) Prior Publication Data
US 2013/0001556 A1 Jan. 3, 2013

(30) Foreign Application Priority Data

Jun. 30, 2011 (CN) .......................... 2011 1 0181626

(51) Int. Cl.
*H01L 35/24* (2006.01)
*H01L 51/00* (2006.01)
(52) U.S. Cl.
USPC ........................ 257/40; 257/59; 257/E39.009

(58) Field of Classification Search
USPC .................................. 257/40, 59, 72, E39.009
See application file for complete search history.

(56) References Cited

U.S. PATENT DOCUMENTS 8,309,954 B2 * 11/2012 Ito ................................... 257/40

* cited by examiner

*Primary Examiner* — Hoai V Pham
(74) *Attorney, Agent, or Firm* — Altis Law Group, Inc.

(57) ABSTRACT

A thin film transistor and a press sensing device using the thin film transistor are disclosed. The thin film transistor, comprises a source electrode; a drain electrode spaced from the source electrode; a semiconductor layer electrically connected with the source electrode and the drain electrode, a channel defined in the semiconductor layer and located between the source electrode and the drain electrode; and a gate electrode electrically insulated from the semiconductor layer; and an insulative layer configured for insulating the source electrode, the drain electrode, and the semiconductor layer from each other, wherein the insulative layer is made of a polymeric material with an elastic modulus ranged from about 0.1 megapascal (MPa) to about 10 MPa.

20 Claims, 7 Drawing Sheets

THIN FILM TRANSISTOR AND PRESS SENSING DEVICE USING THE SAME

RELATED APPLICATIONS

This application claims all benefits accruing under 35 U.S.C. §119 from China Patent Application No. 201110181626.3, filed on Jun. 30, 2011 in the China Intellectual Property Office, the disclosure of which is incorporated herein by reference.

BACKGROUND

1. Technical Field

The present disclosure relates to a thin film transistor and a press sensing device using the thin film transistor.

2. Discussion of Related Art

A typical thin film transistor (TFT) mainly comprises a substrate, a gate electrode, an insulative layer, a drain electrode, a source electrode, and a semiconductor layer. Wherein, the gate electrode is insulated from the semiconductor layer by the insulative layer. The source electrode and the drain electrode are insulated from each other. The source electrode and the drain electrode are both electrically connected with the semiconductor layer. The source electrode, the drain electrode, and the gate electrode are all made of electrically conductive materials. The electrically conductive materials usually are metals or alloys. When a pressure is applied on the gate electrode, the semiconductor layer may generate a number of carriers. When the amount of the carriers reaches a certain level, the source electrode and the drain electrode may form an electrically conductive pathway, therefore, an electrical current flowing from the source electrode to the drain electrode is generated. However, parameters of the thin film transistor (e.g. electrical current between the source electrode and the gate electrode, the gate electrode capacitance, etc) are fixed values and may not be adjusted, which limits applications of which the thin film transistors may be applied.

What is needed, therefore, is to provide a thin film transistor and a press sensing device using the thin film transistor, which may overcome the shortcomings as discussed above.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
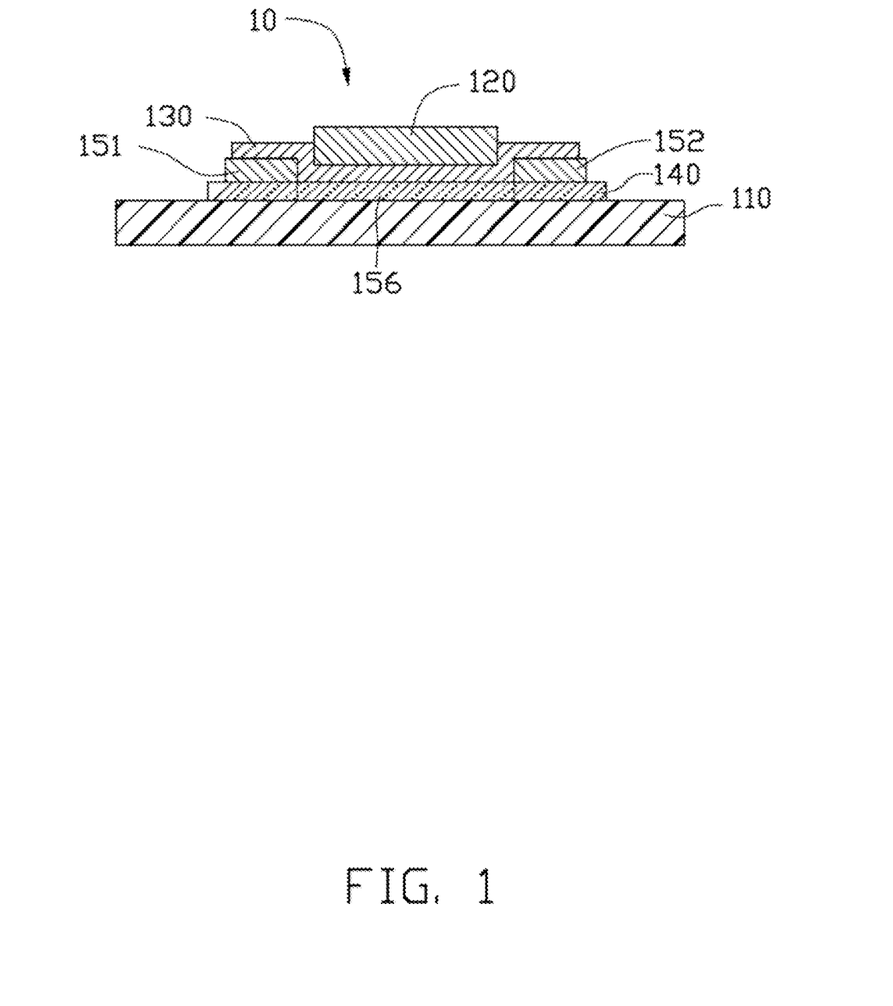
FIG. 1 is cut-away view of one embodiment of a thin film transistor comprising a source gate and a drain gate.
Figure 2:
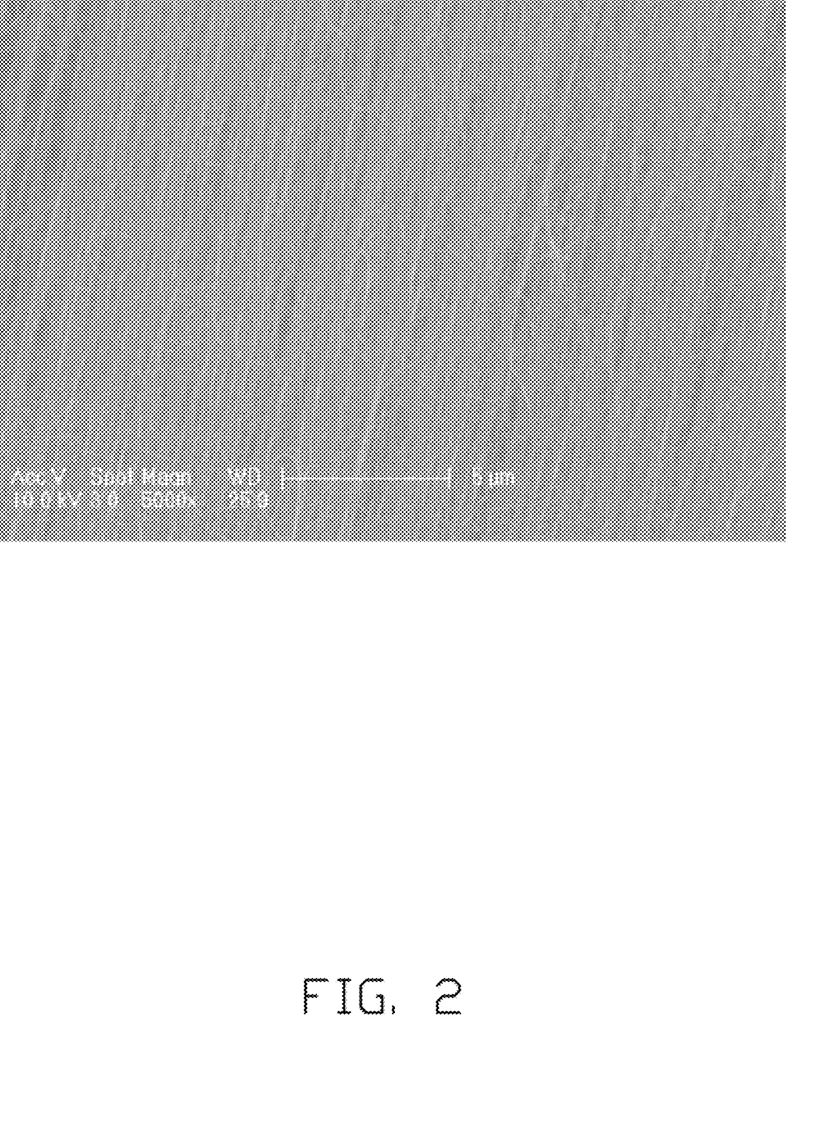
FIG. 2 shows a scanning electronic microscope image of a carbon nanotube film in the thin film transistor of FIG. 1.

Referring to FIG. 1 and FIG. 2, wherein one embodiment of a thin film transistor 10 is provided. The thin film transistor 10 may be controlled by a pressure applied on the thin film transistor 10 to work or stop. The thin film transistor 10 has a top gate structure and comprises a gate electrode 120, an insulative layer 130, a semiconductor layer 140, a source electrode 151 and a drain electrode 152. The thin film transistor 10 may be on an insulative board 110. The insulative layer 130 is a flexible polymer layer, and an elastic modulus of the flexible polymer layer may be in a range from about 0.1 megapascal (MPa) to about 10 MPa, for example 1 MPa, 3 MPa, 5 MPa, or 8 MPa.

The semiconductor layer 140 is disposed on the insulative board 110. The source electrode 151 and the drain electrode 152 are spaced from each other, and electrically connected to the semiconductor layer 140. The insulative layer 130 is disposed between the semiconductor layer 140 and the gate electrode 120. The insulative layer 130 is on a surface of the semiconductor layer 140. The gate electrode 120 is disposed on the insulative layer 130, and above the semiconductor layer 140. The gate electrode 120 is electrically insulated from the semiconductor layer 140, the source electrode 151, and the drain electrode 152 by the insulative layer 130. A channel 156 is formed in the semiconductor layer 140 in a region defined and located between the source electrode 151 and the drain electrode 152. In one embodiment, the gate electrode 120 is located on a surface of the insulative layer 130 corresponding to the channel 156.

The source electrode 151 and the drain electrode 152 may be disposed on the semiconductor layer 140, or on the insulative board 110. More specifically, the source electrode 151 and the drain electrode 152 may be disposed on a top surface of the semiconductor layer 140, and at the same side of the semiconductor layer 140 as the gate electrode 120. In other embodiments, the source electrode 151 and the drain electrode 152 may be disposed on the insulative board 110, and covered by the semiconductor layer 140, wherein the source electrode 151 and the drain electrode 152 are at a different side of the semiconductor layer 140 from the gate electrode 120. In other embodiments, the source electrode 151 and the drain electrode 152 may be formed on the insulative board 110, and located on a same surface of the semiconductor layer 140.

The insulative board 110 is configured to support the thin film transistor 10. A material of the insulative board 110 may be silicon, silicon dioxide, glass, ceramic, diamond, or other inorganic material. The material of the insulative board 110 may also be plastic material, resin, or other polymer material. In one embodiment, the material of the insulative board 110 is silicon. A plurality of the thin film transistors 10 may be disposed on the insulative board 110 to form a thin film transistor panel, or other thin film transistor semiconductor device.

A material of the semiconductor layer 140 may be amorphous silicone (a-Si), poly-silicone (p-Si), organic semiconductor material, or semiconductor carbon nanotubes. In one embodiment, the semiconductor layer 140 is a semiconductor carbon nanotube layer. The semiconductor carbon nanotube layer comprises a plurality of single-walled carbon nanotubes, a plurality of double-walled carbon nanotubes, or a combination thereof. A diameter of each of the plurality of single-walled carbon nanotubes is in the approximate range from 0.5 nanometers (nm) to 50 nm. A diameter of the plurality of double-walled carbon nanotubes is in the approximate range from 1.0 nm to 50 nm. In one embodiment, the diameter of the semiconductor carbon nanotubes is less than 10 nm.

Specifically, the semiconductor carbon nanotube layer may be a carbon nanotube film, or a number of stacked carbon nanotube films. The carbon nanotube film is formed by a plurality of carbon nanotubes, ordered or otherwise, and has a uniform thickness. The carbon nanotube film may be an ordered film or a disordered film. In the disordered film, the carbon nanotubes may be disordered carbon nanotubes, or isotropic carbon nanotubes. The disordered carbon nanotubes are entangled with each other. The isotropic carbon nanotubes are substantially parallel to a surface of the carbon nanotube film. In the ordered film, the carbon nanotubes are primarily oriented along a same direction in each film and parallel to a surface of the carbon nanotube film. Different stratums/layers of films may have the nanotubes offset from the nanotubes in other films. In one embodiment, the ordered carbon nanotube film comprises a plurality of successive, and oriented carbon nanotubes joined end to end by van der Waals attractive forces.

When the carbon nanotube layer comprises a plurality of ordered carbon nanotube films, the carbon nanotubes in different carbon nanotube films may be aligned along a same direction, or aligned along a different direction. An angle α between the alignment directions of the carbon nanotubes in each two adjacent carbon nanotube films is in a range between zero degree and 90 degrees.

It is to be understood that, the semiconductor carbon nanotube layer may comprise at least one carbon nanotube yarn. A carbon nanotube yarn has a shape of a very narrow film. Microscopic structures of an oriented carbon nanotube film and a carbon nanotube yarn structure are similar. A structure of a carbon nanotube yarn comprises a plurality of successive and oriented carbon nanotubes joined end to end by van der Waals attractive force. The carbon nanotubes in the carbon nanotube yarn are substantially aligned along a length direction of the carbon nanotube yarn. Further, the carbon nanotube yarn may be twisted or untwisted. A twisted carbon nanotube yarn structure has a round-shaped cross-section.

A length of the semiconductor layer 140 may be in an approximate range from 1 micrometer (μm) to 100 μm. A width of the semiconductor layer 140 may be in an approximate range from 1 μm to 1 millimeter (mm). A thickness of the semiconductor layer 140 may be in a range from about 0.5 nm to about 100 μm. A length of the channel 156 may be in an approximate range from 1 μm to 100 μm. A width of the channel 156 may be in an approximate range from 1 μm to 1 mm. In one embodiment, the length of the semiconductor layer 140 is about 50 μm, the width of the semiconductor layer is about 300 μm, the thickness of the semiconductor layer 140 is about 1 μm, the length of the channel 156 is about 40 μm, and the width of the channel 156 is about 300 μm.

A material of the source electrode 151, the drain electrode 152, and the gate electrode 120 has a good conductive property, and may be pure metals, metal alloys, indium tin oxide (ITO), antimony tin oxide (ATO), silver paste, conductive polymer, metallic carbon nanotubes, or carbon nanotube metal composite. The pure metals may be aluminum, copper, tungsten, molybdenum, gold, cesium, or palladium. The metal alloys may be any alloy of aluminum, copper, tungsten, molybdenum, gold, cesium, or palladium. A thickness of the source electrode 151, the drain electrode 152, and the gate electrode 120 is about 0.5 nm to 100 μm. A distance between the source electrode 151 and the drain electrode 152 is about 1 μm to 100 μm. In one embodiment, the material of the source electrode 151, the drain electrode 152, and the gate electrode 120 is pure palladium films, thicknesses of the source electrode 151, the drain electrode 152, and the gate electrode 120 are all about 5 nm.

In one embodiment, the semiconductor layer 140 is a carbon nanotube layer comprised of a number of carbon nanotube films, and the carbon nanotubes in the carbon nanotube layer substantially extend along a same direction. The source electrode 151 and the drain electrode 152 are separately arranged along the extending direction of the carbon nanotubes in the carbon nanotube layer.

According to the manufacturing process of the thin film transistor 10, the insulative layer 130 may completely or partly cover the semiconductor layer 140, the source electrode 151, and the drain electrode 152, just to make sure that the semiconductor layer 140 is electrically insulated from the gate electrode 120, and that the gate electrode 120 is electrically insulated from the source electrode 151 and the drain electrode 152. In one embodiment, the source electrode 151 and the drain electrode 152 are located on a top surface of the semiconductor layer 140, the insulative layer 130 is located between the source electrode 151 and the drain electrode 152. The insulative layer 130 covers the semiconductor layer 140.

A material of the insulative layer 130 may be polydimethylsiloxane (PDMS), polyurethane (PU), polyester, styrene-butadiene rubber, fluorine rubber, or silicone rubber. A thickness of the insulative layer 130 is ranged form about 1 nm to about 10 μm, such as, 10 nm, 50 nm, 100 nm, 500 nm, 1 μm or 5 μm. In some embodiments, the thickness of the insulative layer 130 ranges from about 50 nm to about 1 μm. In one embodiment, the insulative layer 130 is a polydimethylsiloxane (PDMS) layer, the elastic modulus of polydimethylsiloxane (PDMS) is about 500 kilo pascals, the thickness of the insulative layer 130 is about 500 nm.

When a pressure is applied on the gate electrode 120 in the thin film transistor 10, the insulative layer 130 also may be pressed by the pressure. The insulative layer 130 has a good elasticity, and the thickness of the insulative layer 130 will be changed by the pressure, which causes a distance change between the gate electrode 120 and the source electrode 151. As a result, a capacitance $C_{OX}$ of the gate electrode 120 and the current $I_{DS}$ between the source electrode 151 and the drain electrode 152 is changed. Therefore, characteristics of the thin film transistor 10 may be controlled by the pressure applied on the insulative layer 130.

Figure 3:
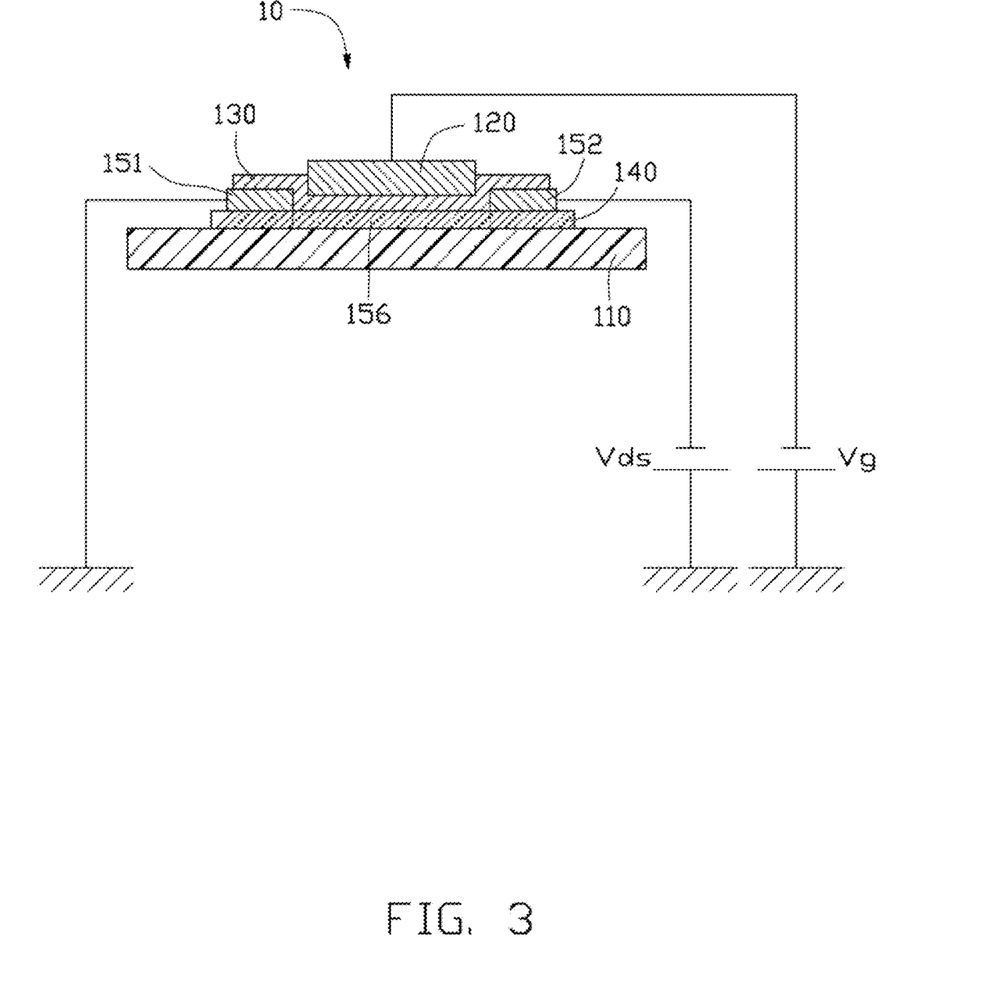
FIG. 3 is a schematic view of the thin film transistor of FIG. 1 in working status.

Referring to FIG. 3, when the thin film transistor 10 is in use, the source electrode 151 is grounded, a voltage $V_g$ is applied on the gate electrode 120, and a voltage $V_{ds}$ is applied on the drain electrode 152. An electrical field is formed in the channel 156 of the semiconductor layer 140 by the voltage $V_g$. Accordingly, carriers are generated in the channel 156 nearing the gate electrode 120. As the $V_g$ increases to a threshold voltage $V_{TH}$ between the source electrode 151 and the drain electrode 152, an electrical pathway is formed in the channel 156. As such, a current will flow through the channel 156 from the source electrode 151 to the drain electrode 152. Thus, the source electrode 151 and the drain electrode 152 are electrically connected with each other, the thin film transistor 10 is in working status.

In one embodiment, the current $I_{ds}$ between the source electrode 151 and the drain electrode 152 in the thin film transistor 10 may satisfy the following relationship:

$$I_{DS} = \frac{\mu_n C_{OX}}{2}\left(\frac{W}{L}\right)[2(V_g - V_{TH})V_{ds} - V_{ds}^2] \quad \text{Equation 1}$$

Wherein, $\mu_n$ is carrier mobility, W is the width of the channel 156, L is the length of the channel 156, $V_{TH}$ is the threshold voltage, $V_g$ is the voltage applied on the gate electrode 120, $V_{ds}$ is the voltage applied on the drain electrode 152, and $C_{OX}$ is the capacitance of the gate electrode 120. The current $I_{ds}$ between the source electrode 151 and the drain electrode 152 has a direct ratio relationship with the capacitance $C_{OX}$ of the gate electrode 120.

The capacitance $C_{OX}$ of the gate electrode 120 may satisfy the following relationship:

$$C_{OX} = \frac{\varepsilon S}{D} \quad \text{Equation 2}$$

Wherein, $\varepsilon$ is a dielectric constant of the insulative layer 130, S is an area of the channel 156, D is the thickness of the insulative layer 130. The capacitance $C_{OX}$ of the gate electrode 120 has an inverse ratio relationship with the thickness D of the insulative layer 130.

When a pressure is perpendicularly and uniformly applied on the gate electrode 120, the pressure may also be perpendicularly and uniformly applied on the insulative layer 130. The pressure applied on the gate electrode 120 may be made by pressing device or any other means. When the thickness of the insulative layer 130, D, decreases under the pressure, the length along the direction perpendicular to the pressure will increase, as such the effective area of the insulative layer 130 corresponding to the channel 156 is kept constant, since the area of the channel 156, S, is kept constant. The thickness of the insulative layer 130, D, is reduced under the pressure, the capacitance of the gate electrode 120, $C_{OX}$, will increase, according to Equation 2. As a result, the current between the source electrode 151 and the drain electrode 152, $I_{ds}$, will also increase, according to Equation 1.

Figure 4:
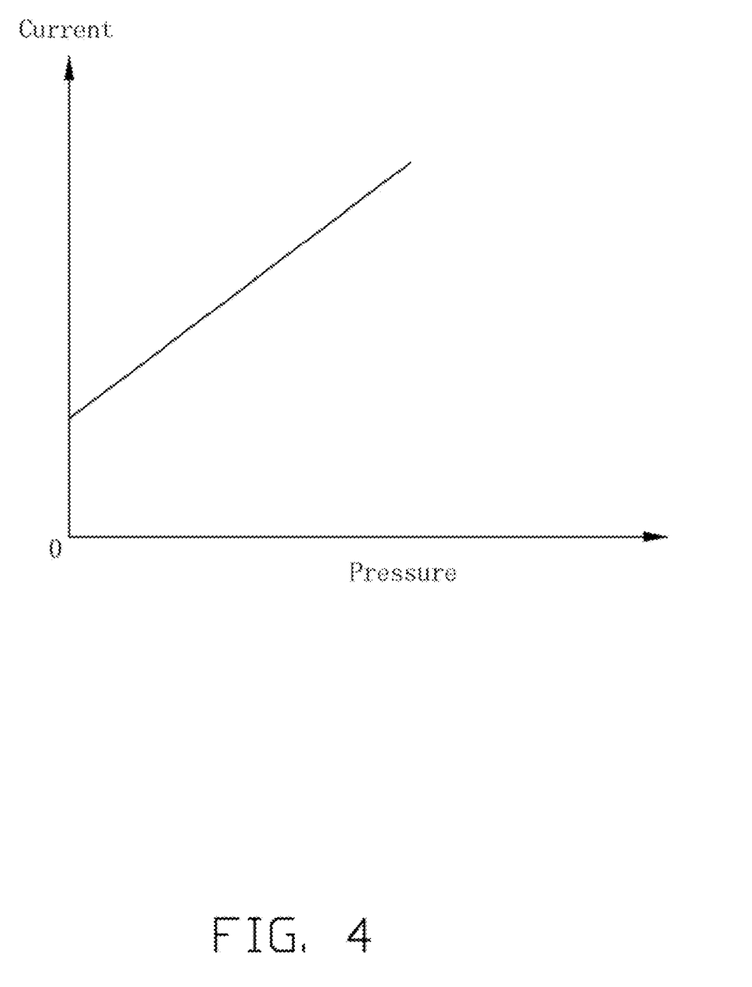
FIG. 4 shows a relationship graph of current-voltage between the source gate and the drain gate shown in FIG. 1.

If the pressure increases gradually, the current $I_{ds}$ will increase gradually, too. If the pressure decreases gradually, the current $I_{ds}$ will decrease gradually, too. In other word, the capacitance of the gate electrode 120, $C_{OX}$ will vary with the pressure, and the current $I_{ds}$ will vary correspondingly. A linear relationship between the pressure and the current $I_{ds}$, is illustrated in FIG. 4. Parameters of the thin film transistor 10 may be controlled by the pressure so that the film transistor 10 may be widely used in different electronic fields.

In one example, a pressure of about 100 KPa is perpendicularly applied on the gate electrode 130, the thickness D of the gate electrode 130 is reduced to about 80% of an original thickness of the gate electrode 130, the capacitance $C_{OX}$ of the gate electrode 120 is increased to about 125% of an original capacitance of the gate electrode 120, thus, the current $I_{ds}$ between the source electrode 151 and drain electrode 152 is also increased to about 125% of an original current between the source electrode 151 and drain electrode 152.

The insulative layer 130 is made of polymeric material with a certain elastic modulus, and the capacitance $C_{OX}$ of the gate electrode 120 may be adjusted by pressures required by an intended use. Thus, the thin film transistor 10 may be controlled by the pressures of the intended use of the thing film transistor 10. The insulative layer 130 is made of flexible polymer materials which generally have large dielectric constants $\varepsilon$. As in Equation 1, the capacitance $C_{OX}$ of the gate electrode 120 may change greatly by a small amount decrease of D, the thickness of the insulative layer corresponding to an increase of the pressure. Hence, the current between the source electrode 151 and drain electrode 152, $I_{DS}$ may be varied in a large scope, as according to Equation 2. Therefore, accuracies of the thin film transistor 10 may be improved.

Figure 5:
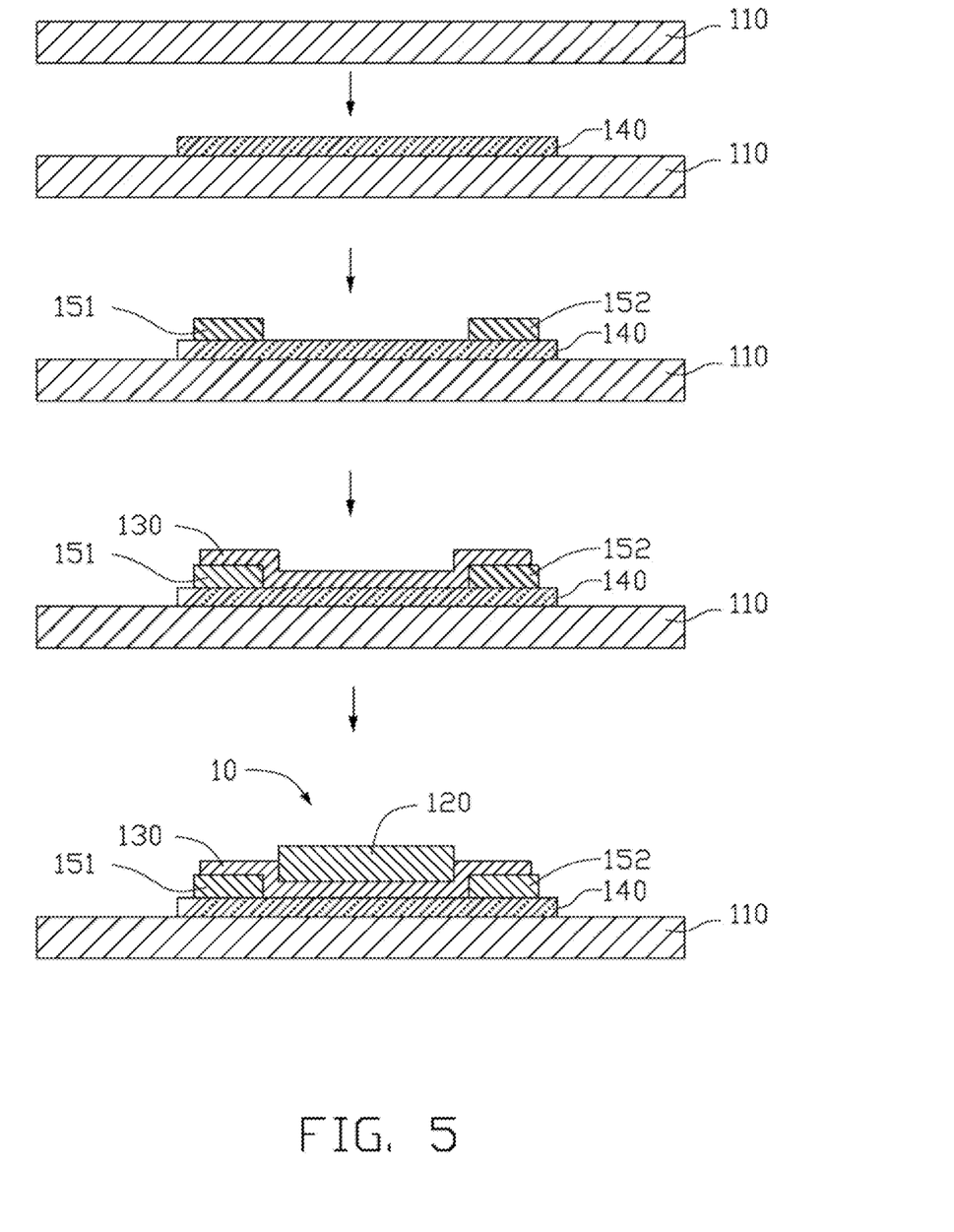
FIG. 5 is a flowchart of a process of making the thin film transistor shown in FIG. 1.

Referring to FIG. 5, a method for making the thin film transistor 10 of the present disclosure is provided. The method comprises the following steps: providing the insulative board 110; applying the semiconductor layer 140 on the insulative board 110; forming the source electrode 151 and the drain electrode 152 on the semiconductor layer 140, wherein the source electrode 151 and the drain electrode 152 are separated from each other and electrically connected with the semiconductor layer 140; forming the insulative layer 130 on the semiconductor layer 140, wherein the insulative layer 130 may be directly adhered to the semiconductor layer 140 by an adhesive, or by a viscosity of the polymeric material; and forming the gate electrode 120 on the insulative layer 130.

In one embodiment, the insulative layer 130 may be formed on the semiconductor layer 140 by coating the polymeric material in a molten, or a liquid state.

Figure 6:
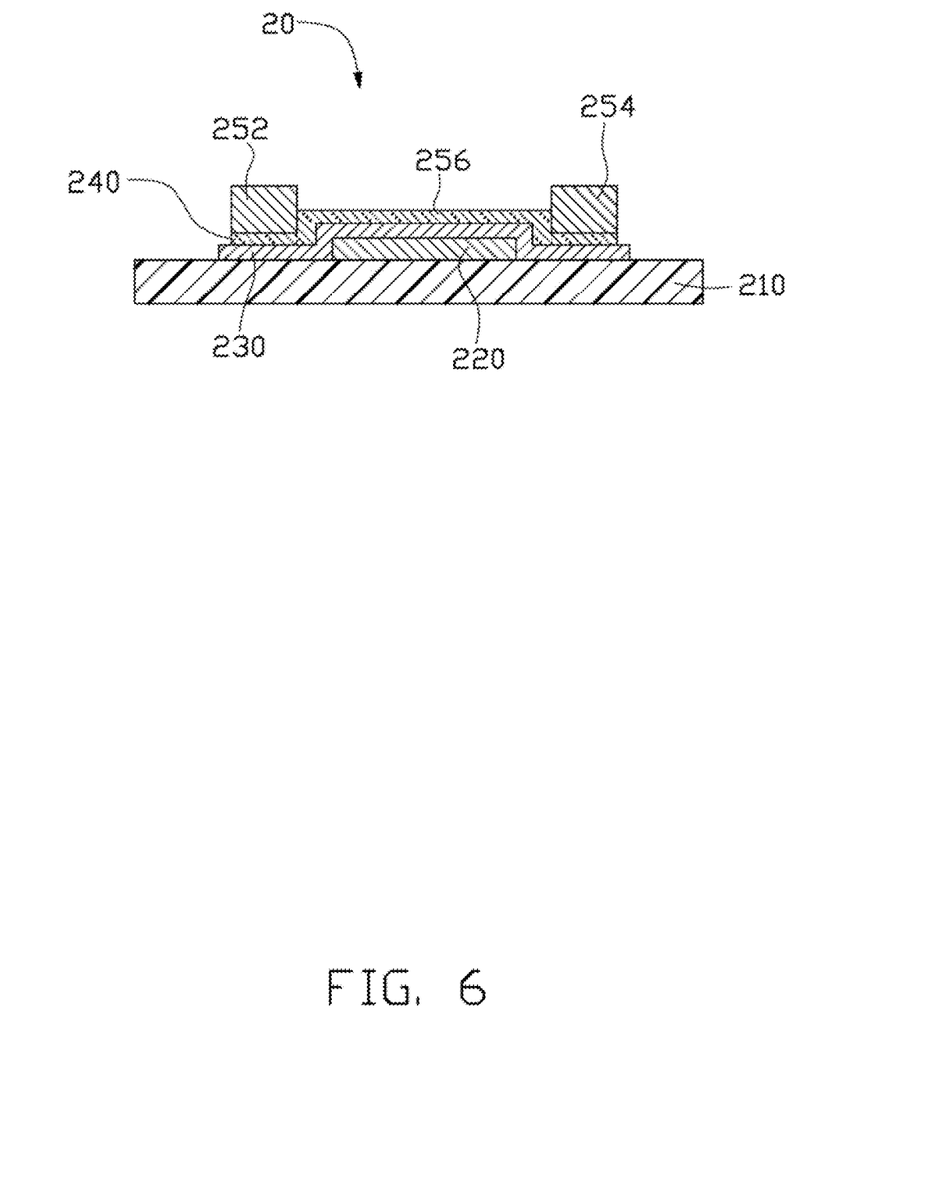
FIG. 6 is cut-away view of another embodiment of a thin film transistor.

Referring to FIG. 6, one other embodiment of a thin film transistor 20 controlled by pressure is provided. The thin film transistor 20 has a bottom gate structure and comprises a gate electrode 220, an insulative layer 230, a semiconductor layer 240, a source electrode 252 and a drain electrode 254. The thin film transistor 20 is located on an insulative board 210. The insulative layer 230 is a polymer layer. A channel 256 is formed in the semiconductor layer 240 in a region defined and located between the source electrode 252 and the drain electrode 254.

The structure of the thin film transistor 20 is similar to that of the thin film transistor 10, except that the gate electrode 220 is located on the insulative board 210. The insulative layer 230 covers the gate electrode 220. The semiconductor layer 240 is located on the insulative layer 230, and insulated from the gate electrode 220 by the insulative layer 230. Thus, when the thin film transistor 20 is in use, a pressure is applied on the semiconductor layer 240, and the insulative layer 230 may also be pressed by the pressure.

Other characteristics of the thin film transistor 20 are the same as those of the thin film transistor 10 discussed above.

Figure 7:
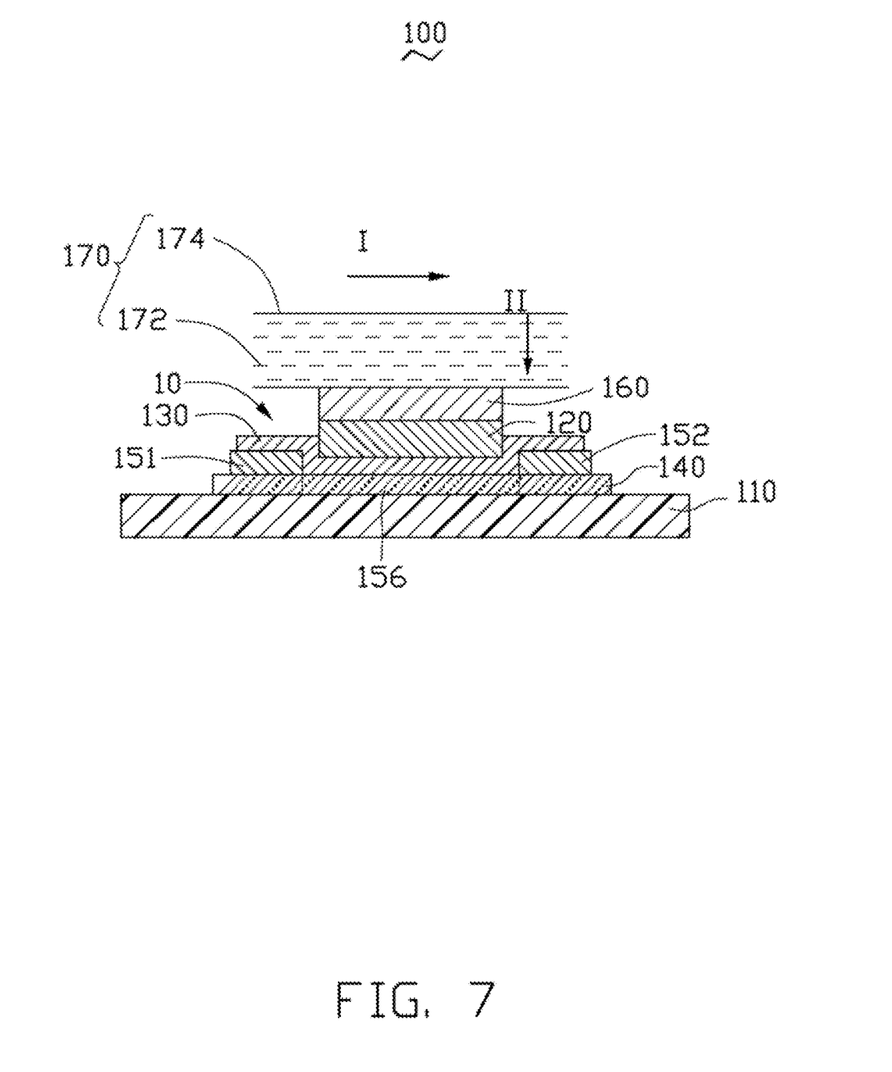
FIG. 7 is cut-away view of one embodiment of a press sensing device.

Referring to FIG. 7, one embodiment of a press sensing device 100 is provided. The press sensing device 100 comprises a press producing unit 170, and the thin film transistor 10. The press producing unit 170 applies a perpendicular pressure on the thin film transistor 10. Specifically, the press producing unit 170 applies the pressure on the insulative layer 130 in the thin film transistor 10.

The press producing unit 170 may generate a pressure by a solid, a gas, or a liquid. The pressure produced by the solid may be a pressure from a finger or a heavy object. The pressure produced by the gas may be generated by a change of gas pressures. The pressure produced by the liquid may be formed by flowing of the liquid or a weight of the liquid. Therefore, the press sensing device 100 may be a water tower, an automatic control system of gas pressures or water-levels in a boiler.

In one embodiment, the press producing unit 170 comprises a liquid 172, and a passage 174 receiving the liquid 172. The liquid 172 contacts with an inner side wall of the passage 174. The thin film transistor 10 is located on an outer surface of the passage 174. The liquid 172 may flow in the passage 174 along direction I shown in FIG. 7. The liquid 172 applies a pressure P on the thin film transistor 10 along direction II shown in FIG. 7. The passage 174 may be made of polymeric or metallic materials. For example, the material of the passage 174 may be polyethylene, polypropylene, or steel. Because the capacitance of the gate electrode 120, $C_{OX}$, and the change range of the current between the source electrode 151 and the drain electrode 152, $I_{ds}$ are related to the pressure produced by the liquid 172, therefore the pressure P produced by the liquid 172 may be calculated by the capacitance $C_{OX}$ and the current $I_{DS}$. The pressure P and the flowing speed v of the liquid 172 may satisfy the following relationship:

$$P + \rho g h + \frac{1}{2}\rho v^2 = Const \quad \text{Equation 3}$$

Wherein, $\rho$ is the density of the liquid 172; g is gravity acceleration constant; h is the depth of the liquid 172 in the passage 174 along the II direction, v is a flowing speed of the liquid 172, and Const stands for a constant. Therefore, the flowing speed of the liquid 172, v, may be accounted for according to the pressure P of the liquid 172. In another words, the flowing speed of the liquid, v, may be accounted for in terms of the capacitance $C_{OX}$ and the current $I_{ds}$.

The thin film transistor 10 and the press producing unit 170 should be electrically insulated from each other, therefore the press sensing device 100 may further comprise a packaged layer 160 located between the outer surface of the passage 174 and the gate electrode 120 in the thin film transistor 10. The packaged layer 160 is made of flexible and electrically insulative materials, such as, resin or insulative plastics. In one embodiment, the packaged layer 160 is made of insulative plastic, and the thickness of the packaged layer 160 is about 200 nm.

In another embodiment, the thin film transistor 10 is completely enveloped by the packaged layer 160. The thin film transistor 10 may be located on the inner surface of the passage 174, and the insulative board 110 in the thin film transistor 10 is attached to the inner surface of the passage 174. The thin film transistor 10 is electrically insulated from the liquid 172 by the packaged layer 160.

The thin film transistor 10 may further comprise a pressed element (not labeled). The pressure generated by the press producing unit 170 is directly applied on the pressed element, and then the pressure is applied on the insulative layer 130 in the thin film transistor 10 by the pressed element.

The press sensing device 100 may further comprise a sensing date unit (not labeled) connected with the thin film transistor 10. The sensing date unit is adapted to display signals converted from current changes resulted from the pressure applied on the thin film transistor 10.

It may be understood that the thin film transistor 20 may replace the thin film transistor 10 in the press sensing device 100.

According to the above descriptions, the thin film transistors controlled by the pressure of the present disclosure have the following advantages. First, the structure of the thin film transistor is simple and the thickness of the insulative layer is relatively thin. Secondly, the dielectric constant of the insulative layer made of a polymeric material is large, the capacitance of the gate electrodes $C_{OX}$ may change greatly by applying a small amount of pressure on the thin film transistor, and the current between the source electrode and drain electrode $I_{ds}$ may be varied in a large scope. Therefore, the accuracy of the thin film transistor may be improved. The thin film transistors as disclosed in the present disclosure may be applied in medical devices, regulators, keystroke of electronic devices, flow automatic controllers, and industrial control and monitor devices. Thirdly, the polymeric materials are easy to produce, therefore manufacturing processes of the insulative layers 130, 240, and the thin film transistors 10, 20 are simple, and low cost. The thin film transistors as disclosed in the present disclosure are suitable for a large scale manufacturing. Finally, the thin film transistors may be made flexible and suitable for applications in flexible electronic devices if the semiconductor layers are made of flexible materials such as carbon nanotube layers.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

What is claimed is:

1. A thin film transistor, comprising:
   a source electrode;
   a drain electrode spaced from the source electrode;
   a semiconductor layer electrically connected with the source electrode and the drain electrode, a channel defined in the semiconductor layer and located between the source electrode and the drain electrode; and
   a gate electrode electrically insulated from the semiconductor layer; and
   an insulative layer configured for insulating the source electrode, the drain electrode, and the semiconductor layer from each other, wherein the insulative layer is made of a polymeric material with an elastic modulus ranged from about 0.1 megapascal (MPa) to about 10 MPa.

2. The thin film transistor of claim 1, wherein a material of the insulative layer is selected from the group consisting of polydimethylsiloxane, polyurethane, polyester, styrene-butadiene rubber, fluorine rubber, and silicone rubber.

3. The thin film transistor of claim 1, wherein a thickness of the insulative layer is in a range from about 1 nanometer (nm) to about 10 micrometer (μm).

4. The thin film transistor of claim 1, wherein a thickness of the insulative layer is in a range from about 50 nm to about 1 μm.

5. The thin film transistor of claim 4, wherein a thickness of the insulative layer is about 500 nm.

6. The thin film transistor of claim 1, wherein the elastic modulus of the insulative layer is about 1 MPa, 3 MPa, 5 MPa, or 8 MPa.

7. The thin film transistor of claim 1, wherein a material of the semiconductor layer is amorphous silicone, poly-silicone, organic semiconductor material, or carbon nanotubes.

8. The thin film transistor of claim 1, wherein the semiconductor layer is a carbon nanotube layer comprising a plurality of carbon nanotubes substantially extend along an extending direction, the source electrode and the drain electrode are separated from each other along the extending direction of the plurality of carbon nanotubes.

9. The thin film transistor of claim 1, wherein the insulative layer is located between the gate electrode and the semiconductor layer.

10. The thin film transistor of claim 1, wherein the source electrode and drain electrode are located on a surface of the semiconductor layer.

11. The thin film transistor of claim 1, wherein the thin film transistor has a top gate structure.

12. The thin film transistor of claim 11, wherein the gate electrode is located on the insulative layer, the gate electrode and the channel are arranged side by side.

13. The thin film transistor of claim 1, wherein the thin film transistor has a bottom gate structure.

14. A press sensing device, comprising:
a press producing unit producing a pressure;
a thin film transistor pressed by the pressure, the thin film transistor comprises a source electrode; a drain electrode spaced from the source electrode; a semiconductor layer electrically connected with the source electrode and the drain electrode, a channel defined in the semiconductor layer and located between the source electrode and the drain electrode; a gate electrode electrically insulated from the semiconductor layer; and an insulative layer configured for insulating the source electrode, the drain electrode, and the semiconductor layer from each other, wherein, the insulative layer is made of a polymeric material with an elastic modulus ranged from about 0.1 MPa to about 10 MPa.

15. The press sensing device of claim 14, wherein a material of the insulative layer is selected from the group consisting of polydimethylsiloxane, polyurethane, polyester, styrene-butadiene rubber, fluorine rubber, and silicone rubber.

16. The press sensing device of claim 14, wherein a thickness of the insulative layer is in a range from about 1 nm to about 10 μm.

17. The press sensing device of claim 16, wherein the thickness of the insulative layer is in a range from about 50 nm to about 1 μm.

18. The press sensing device of claim 14, wherein the elastic modulus of the insulative layer is about 1 MPa, 3 MPa, 5 MPa, or 8 MPa.

19. The press sensing device of claim 14, wherein the pressure is produced by a solid, a gas, or a liquid.

20. The press sensing device of claim 14, the press producing unit comprises a liquid, and a passage receiving the liquid, wherein the pressure and a flowing speed of the liquid have the following relationship:

$$P + \rho g h + \frac{1}{2}\rho v^2 = Const$$

wherein, P is the pressure; $\rho$ is a density of the liquid; g is a gravity acceleration constant; h is a depth of the liquid in the passage along a pressing direction, $v$ is the flowing speed of the liquid; and Const is a constant.

* * * * *